(12) United States Patent
Meserth et al.

(10) Patent No.: US 7,537,517 B1
(45) Date of Patent: *May 26, 2009

(54) SELF-BRUSHING AIR MOVING DEVICE

(75) Inventors: Timothy Meserth, Durham, NC (US); James S. Womble, Hillsborough, NC (US); Richard M. Barina, Sebring, FL (US); Daniel P. Kelaher, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,299

(22) Filed: Aug. 19, 2008

Related U.S. Application Data

(63) Continuation of application No. 12/046,567, filed on Mar. 12, 2008, now Pat. No. 7,431,640.

(51) Int. Cl.
*H05K 7/20* (2006.01)
*F24F 13/08* (2006.01)
*F24F 7/00* (2006.01)
*B01D 41/04* (2006.01)

(52) U.S. Cl. .................. 454/184; 454/259; 454/353; 361/687; 361/695; 55/295

(58) Field of Classification Search .......... 454/227, 454/259, 353, 184, 359; 361/687, 695; 55/295
See application file for complete search history.

(56) References Cited

U.S. PATENT DOCUMENTS

| | | | | |
|---|---|---|---|---|
| 2,586,997 A | * | 2/1952 | Schach | 137/601.12 |
| 2,974,680 A | * | 3/1961 | Kreuttner | 137/595 |
| 3,159,572 A | * | 12/1964 | Ranhagen | 209/273 |
| 3,566,923 A | * | 3/1971 | Avery | 138/43 |
| 3,752,319 A | * | 8/1973 | Richter | 210/357 |
| 3,755,072 A | * | 8/1973 | Ostberg et al. | 162/251 |
| 5,249,602 A | * | 10/1993 | Sandor et al. | 137/625.33 |
| 6,312,590 B1 | * | 11/2001 | Isola | 210/155 |
| 6,688,965 B1 | | 2/2004 | Crippen et al. | |
| 2007/0207723 A1 | | 9/2007 | Baker et al. | |

FOREIGN PATENT DOCUMENTS

JP 03207331 A * 9/1991

* cited by examiner

*Primary Examiner*—Steven B McAllister
*Assistant Examiner*—Patrick F. O'Reilly, III
(74) *Attorney, Agent, or Firm*—The Law Firm of Andrea Hence Evans, LLC

(57) ABSTRACT

An air moving device assembly in a computer system has an air moving device such as a fan or blower within a housing for moving air from an air inlet to an air outlet. A mesh with a plurality of openings covers the air outlet. A back flow damper assembly is positioned over the air outlet. The back flow damper assembly further comprises at least one damper door movable in an open position and a closed position. The damper door has at least one tooth such that when the damper door is in the closed position, the tooth interacts with at least one of the plurality of openings in the mesh. By periodically cycling the air moving device controlled by device management software, the teeth will close and open, loosening debris from the mesh, allowing the debris to be blown out the rear of the housing once the device is turned back on.

1 Claim, 3 Drawing Sheets

SELF-BRUSHING AIR MOVING DEVICE

RELATED APPLICATIONS

The present application is a continuation of prior U.S. application Ser. No. 12/046,567, filed Mar. 12, 2008, the entirety of which is incorporated herein by reference.

FIELD OF THE INVENTION

The present invention generally relates to computer systems and other information processing systems and more particularly, to an automatic air moving device to prevent debris and dust build up in a computer system. This could also be applied to any type of system having an air moving device with a protective screen blowing exhaust air.

BACKGROUND OF THE INVENTION

Computer systems, such as server blade systems, typically include cooling devices such as fans, blowers and other air moving devices. Air is moved through various components of the systems and ultimately into some number of air moving devices in the back of the main chassis. A protective mesh for electromagnetic compatibility (EMC) or safety is located on the air moving device exhaust. The protective mesh can easily get clogged with dust and debris. This severely reduces the air flow rate throughout the system. Dust build up on protective mesh can greatly increase air flow impedance and reduce total amount of air being pulled through a heat generating device, like a computer system. This reduction in air flow corresponds to a reduced cooling for these hot components, increasing the risk of component failures due to excessive temperatures.

Prior art attempts to clean the air moving devices include providing filtering and cooling systems in the air moving devices. However, these filters build up with dust and debris and require manual cleaning. Also, brushes and vacuums have been used to disrupt and remove dust from the mesh or non-moving part in the air moving system. This is ineffective because this cleaning system is dependent on the users schedule and the manual cleaning can cause damage to the mesh. Electrode self cleaning mechanisms have been used to remove debris, however, a fully coated electrode no longer properly collects dust and this system typically requires additional manual cleaning to work properly. Manually distorting a filter in an air moving device has been provided to remove debris from the filter. Lastly, providing a heat exchanger and reversing the air flow is used to remove debris from the system while withdrawing heat has been provided.

In summary, none of these methods or systems in the prior art automatically and effectively solve the problem of debris and dust build up on protective mesh in air moving devices.

SUMMARY OF THE INVENTION

An effective method of cleaning the mesh in an air moving device using the damper doors is necessary to aid in proper air circulation.

This invention introduces a self-brushing air moving device. The device comprises modified damper doors with teeth that automatically interact with the mesh openings on the mesh in the air moving device to dislodge dust and prevent debris and dust buildup on the mesh.

An aspect of an embodiment of the present invention provides a system to stop and start each air moving device for cleaning.

A further aspect of an embodiment of the present invention provides damper doors that interfere with dust buildup on the protective screen whenever the air moving device is powered off or shut down.

DETAILED DESCRIPTION OF THE INVENTION

Figure 1:
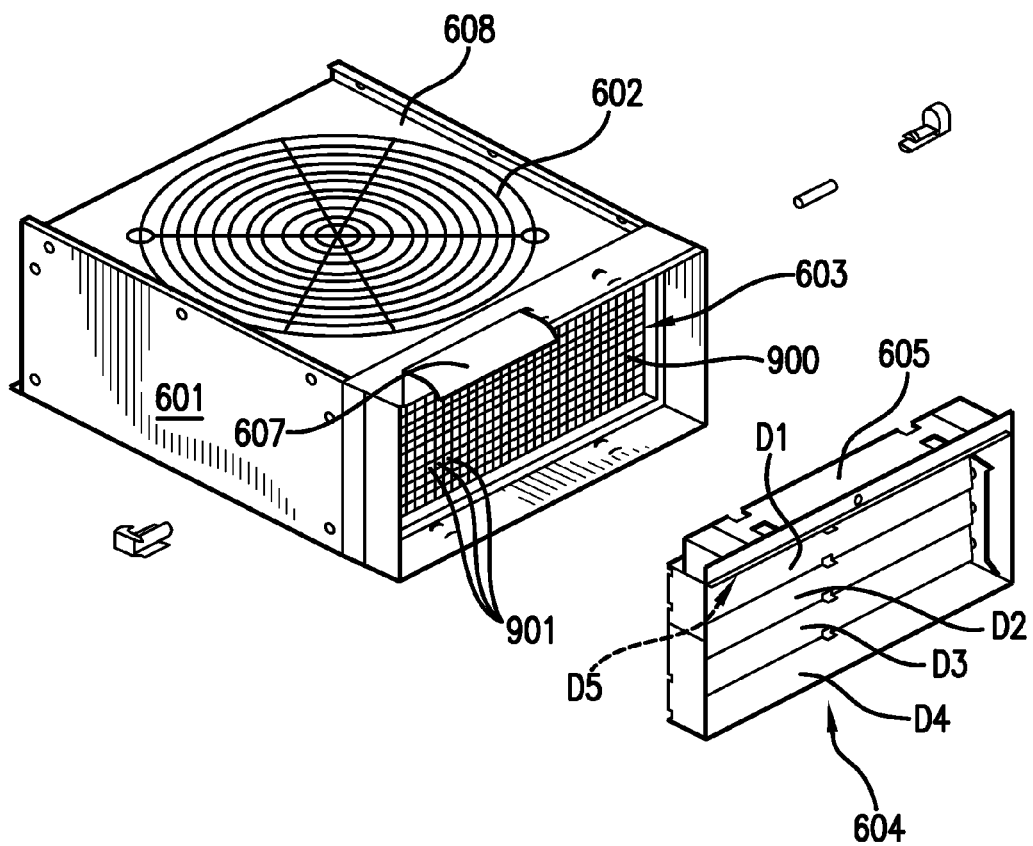
FIG. 1 is a prior art perspective view of an air moving device with a back flow damper assembly removed therefrom.
Figure 3:
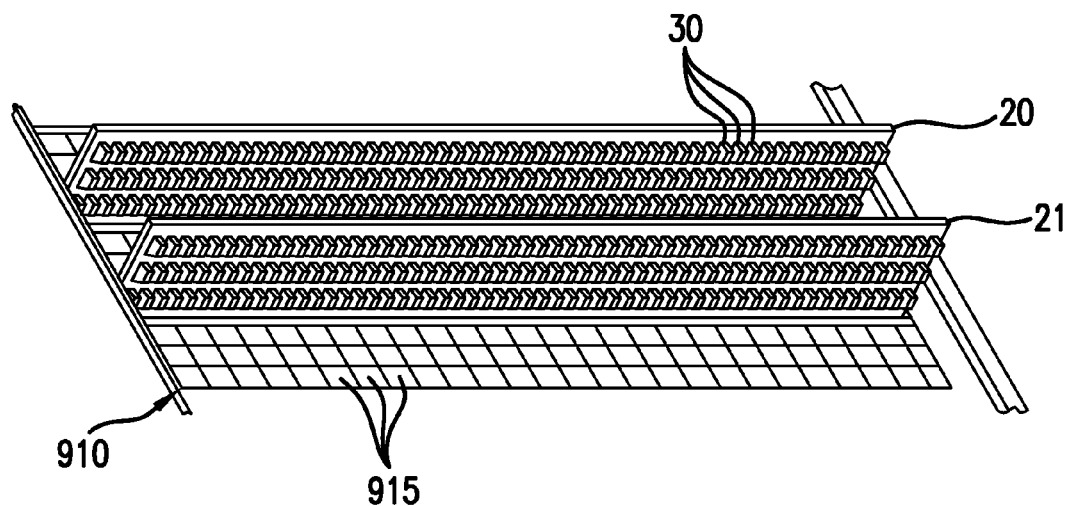
FIG. 3 illustrates the damper door of the present invention.

FIG. 1 is a prior art perspective view of an air moving device with a back flow damper assembly removed therefrom. Air moving device 601 includes a well known blower although a fan or another air moving device could be used. Air moving device 601 includes a housing 608, having an air inlet 602 and an air outlet 603. A mesh or screen 900 covers the air outlet 603. The mesh 900 provides EMC shielding and prevents foreign objects such as fingers, pens, etc. from entering the housing 608. The mesh 900 contains multiple openings 901 to allow airflow. Positioned over the air outlet 603 is a back flow damper assembly 604, which includes a damper frame 605. The damper assembly 604 includes five pivotally mounted damper doors, D1, D2, D3, D4 and D5. The air moving device 601 may be invertible and operable in an inverted orientation, with respect to the vertical axis. When the air moving device 601 is in the inverted position, the damper doors D1, D2, D3, D4, and D5 are positioned along the vertical axis. D1 is shown in FIG. 3 in an inverted positioned. A spring loaded latch 607 latches the air moving device 601 into the chassis of a computer system.

The damper doors, D1, D2, D3, D4, and D5 are freely rotatable. They naturally rotate bi-directionally, in an up and down direction if the air moving device is positioned horizontally or in a non-inverted position as shown in FIG. 1 or in a left and right direction if the air moving device is positioned vertically. D1, D2, and D3 move in unison such that when D3 is rotated up, D4 is rotated up. When D3 is rotated down D4 is not moved. The damper doors, D1-D3 in FIG. 1 are shown in a closed position. D5 is not shown due to the isometric view of FIG. 1 but is also in a closed position. The closed position is defined with the doors D1-D5 covering the mesh 900 and air outlet 603. The open position of the damper doors is defined when the damper doors D1-D5 are open such that they do not cover or close the airflow passage of the outlet 603 or mesh 900. When the air moving device 601 is powered on or in use, the damper doors D1-D5 are pushed into an open position by the air pressure caused by the moving air. When the air moving device is powered off or shut down, the damper doors D1-D5 are in a closed position.

Figure 2:
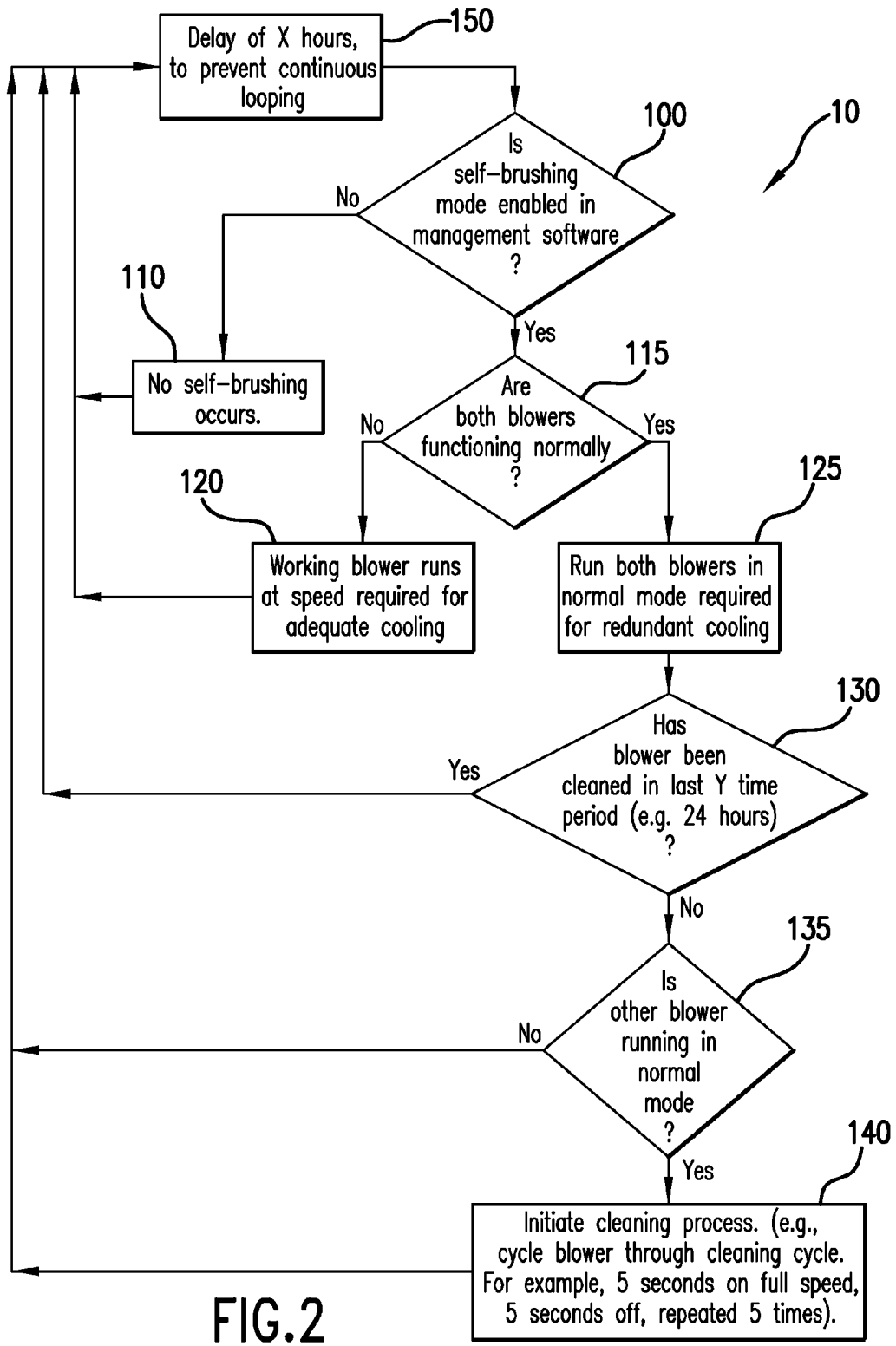
FIG. 2 is a flow chart of the system used to provide self-brushing of the mesh of the present invention.

FIG. 2 is a flow chart of the system used to provide self-brushing of the mesh of the present invention. Components or combinations of components of the backflow damper assembly 604 may perform the elements of flow chart 10 while on an air moving device 601. Software enables the stop and restart of each air moving device 601. Existing damper doors close using gravity or reverse air flow from other air moving devices whenever the air moving device is turned off. This is done to prevent other redundant air moving devices from sucking air through the turned off air moving device and short circuiting the flow necessary to cool the hot components. Dust build up on protective mesh can greatly increase air flow impedance and reduce total amount of air being pulled through a heat generating device like a computer system. This reduction in air flow corresponds to a reduced cooling for these hot components. The software system of the present invention enables self-brushing of the mesh 900. The system determines if the self-brushing mode is enabled in block 100. If the system is not enabled, no self-brushing occurs in block 110. If the system is enabled, it determines if the blowers or air moving devices 601, at least two, are functioning normally in block 115. Block 115 implies that there are multiple air moving devices in a redundant cooling configuration so one device can turn off while the other(s) can still cool the entire system. A non-redundant cooling system can also be used but would require a slightly different control software. If the air moving device is not functioning normally, the working blower works at a speed required for adequate cooling of the computer system in block 120 and this cycle is repeated until both blowers are functioning normally. A delay of X hours occurs at 150 to prevent continuous looping of the system. For example purposes, two air moving devices are disclosed, however, the system can be used for additional air moving devices. If both blowers are functioning properly, both blowers function in normal mode required for redundant cooling in block 125. Then, the system determines if the blowers have been cleaned at a set time period, Y, for example 24 hours in block 130. If the cleaning has been done, the system refers to step 150 and delays the system for X hours to prevent continuous looping. After X hours, the system evaluates if self-brushing mode is enabled at 100. However, if the blowers have not been cleaned during the set time period and it is determined that the blowers are running in normal mode in block 135, the cleaning cycle begins in block 140. During the cleaning cycle, the blower is intermittently powered on full speed for a time period, for example 5 seconds, and powered off for a time period, for example 5 seconds. This cycle is repeated a determined number of times, for example 5 times, to dislodge the dirt and debris from the mesh 900 on the air moving device 601. If the blowers are not running in normal mode, the system is delayed for X hours at 150 and after X hours, repeats step 100 until the blowers are in normal mode in step 135. This system provides automatic periodic cleaning of the mesh and prevents massive dust buildup.

FIG. 3 illustrates the damper doors of the present invention used in the cleaning cycle described in FIG. 2. The damper doors 20, 21 are shown on an air moving device (housing not shown for clarity). The air moving device may be in an orientation other than horizontal but may require a spring to return the doors to the closed position when the air moving device is not moving air. A mesh 910 is shown with a plurality of openings 915 typically 6 mm×6 mm, however the size of the openings of the mesh may be smaller or larger depending on different safety and EMC requirements in a different air moving device. Damper door 20 will be discussed in detail, but all of the damper doors in the present invention are identical. Damper door 20 has rows and columns of teeth 30. The number of rows of teeth and spacing between the rows depends on the number of openings 915 on the mesh 910. The number of teeth 30 depend on the number of openings 915 and at a minimum the number of teeth 30 will be identical to the number of openings 915. Multiple teeth 30 may be sized to fit into one opening 915. The dimensions of the teeth 30 depend on the size of the openings 915 on the mesh 910. The teeth 30 are molded into the plastic material of the damper door 20. They are integrated into the design of the damper doors. However, alternate materials may be used. The teeth 30 are the same material as the damper door 20. Each tooth on the damper door 20 interacts or is moved into the opening 915 on the mesh during the cleaning cycle of the air moving device. When the air moving device is turned off to begin the cleaning cycle described in block 140, the damper doors are closed or moved to cover the mesh 915 such that the teeth 30 are moved into their respective openings 915. Each tooth may correspond to one opening on the mesh so as to substantially cover the periphery of the opening. However multiple teeth may be used for each opening in alternative embodiments. This interaction of damper teeth and protective mesh acts to dislodge dust from building up on mesh and other dust fragments. Rotary motion of the damper doors, approximately 90 degrees of rotation, allows teeth 30 to move into openings 915 in mesh 910. It is possible that a simple cam shape could replace simple circle shape of existing pegs that allow damper doors to rotate closed when blower is off. This cam shape would cause a small amount of vertical motion and provide better brushing of mesh. This cam shape does not cause damper doors to remain shut, in effect locked, when blower turns on and forces damper doors open. The teeth are arrayed to reduce air impedance created from the teeth. The teeth 30 may be on both sides of the damper door 20, since the door moves in both directions to close depending upon the design and orientation of the air moving device housing.

When the air moving device is started again, dust and debris that has been loosened by the closing of the damper doors will be blown out of the back of the air moving device.

The invention has been described in detail with particular reference to certain preferred embodiments thereof, but it will be understood that variations and modifications can be effected within the spirit and scope of the invention

The invention claimed is:

1. A method of using an air moving device assembly in a computer system comprising:
   providing an air moving device within a housing for moving air from an air inlet to an air outlet in the housing;
   providing a mesh covering the air outlet having a plurality of openings;
   providing a back flow damper assembly positioned over the air outlet, wherein the back flow damper assembly further comprises at least one damper door movable in an open position and a closed position, the at least one damper door having at least one tooth such that when the damper door is in the closed position, the at least one tooth interacts with at least one of the plurality of openings in the mesh to substantially cover the periphery of the at least one of the plurality of the openings in the mesh.

* * * * *